(12) United States Patent
Fung et al.

(10) Patent No.: US 12,486,559 B2
(45) Date of Patent: Dec. 2, 2025

(54) METHOD OF METAL OXIDE INFILTRATION INTO PHOTORESIST

(71) Applicant: Applied Materials, Inc., Santa Clara, CA (US)

(72) Inventors: Nancy Fung, Livermore, CA (US); Mark J. Saly, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 333 days.

(21) Appl. No.: 17/741,333

(22) Filed: May 10, 2022

(65) Prior Publication Data
US 2023/0002878 A1 Jan. 5, 2023

Related U.S. Application Data

(60) Provisional application No. 63/217,062, filed on Jun. 30, 2021.

(51) Int. Cl.
C23C 12/00 (2006.01)
C23F 1/12 (2006.01)
H01L 21/47 (2006.01)

(52) U.S. Cl.
CPC ............ *C23C 12/00* (2013.01); *C23F 1/12* (2013.01); *H01L 21/47* (2013.01)

(58) Field of Classification Search
CPC . C23C 12/00; C23F 1/12; H01L 21/47; H01L 21/0337; H01L 21/0332; H01L 21/308; H01L 21/31144; H01L 21/32139; H01L 21/3144; H01L 21/0273–0279; G03F 7/40; G03F 7/405
See application file for complete search history.

(56) References Cited

U.S. PATENT DOCUMENTS 9,310,684 B2 4/2016 Meyers et al.
2015/0234272 A1 8/2015 Sarma et al.
(Continued)

FOREIGN PATENT DOCUMENTS

JP H5241353 A 9/1993
JP 201534987 A 2/2015
(Continued)

OTHER PUBLICATIONS

Hue M.T. Nguyen, Hsin-Yu Tang, Wen-Fei Huang, M.C. Lin, Mechanisms for reactions of trimethylaluminum with molecular oxygen and water, Computational and Theoretical Chemistry, vol. 1035, pp. 39-43, ISSN 2210-271X. (Year: 2014).*
Ghosh. Refractive Index of Silicon Dioxide. Compiled by M. N. Polyanskiy. Refractiveindex.info database of optical constants. Sci. Data 11, 94 https://doi.org/10.1038/s41597-023-02898-2 (Year: 1999).*
Mao, Qiangqiang, et al. Fabrication of porous TiO2—SiO2 multifunctional anti-reflection coatings by sol-gel spin coating method. RSC Advances, 2014, 4, 58101. DOI https://doi.org/10.1039/C4RA10424B (Year: 2014).*
(Continued)

*Primary Examiner* — Zandra V Smith
*Assistant Examiner* — Douglas Yap
(74) *Attorney, Agent, or Firm* — Patterson + Sheridan, LLP (57) ABSTRACT

Disclosed herein is a method for forming metal-oxides in the photoresist to improve profile control. The method includes infiltrating a metal oxide in a photoresist layer by pressurizing a methyl-containing material in a processing environment proximate a film stack. The film stack includes the photoresist layer, the photoresist layer being disposed on top of and in contact with an underlayer. The underlayer disposed on top of a substrate. The method includes etching the film stack including the photoresist layer implanted with the metal oxide.

19 Claims, 4 Drawing Sheets

(56) References Cited

U.S. PATENT DOCUMENTS

| | | | |
|---|---|---|---|
| 2015/0255298 A1* | 9/2015 | Darling | H01L 21/3081 438/703 |
| 2018/0173109 A1 | 6/2018 | Gronheid et al. | |
| 2019/0027369 A1* | 1/2019 | Kori | G03F 7/11 |
| 2020/0133131 A1* | 4/2020 | Ouyang | G03F 7/38 |
| 2020/0273705 A1* | 8/2020 | Singh | H01L 21/0332 |

FOREIGN PATENT DOCUMENTS

| | | | |
|---|---|---|---|
| JP | 2019023251 A | 2/2019 | |
| JP | 2021-044364 A | 3/2021 | |
| TW | 201537619 A | 10/2015 | |
| TW | 202105471 A | 2/2021 | |
| WO | 2018-109554 A1 | 6/2018 | |

OTHER PUBLICATIONS

International Search Report and Written Opinion for International Application No. PCT/US2022/027920 dated Aug. 26, 2022.

Taiwan Office Action dated Mar. 20, 2024 for Appication No. 111118612.

Vanelderen, Pieter, et al., "Impact of Sequential Infiltration Synthesis (SIS) on Roughess and Stochastic Nano-failures for EUVL Patterning", Proceedings og SPIE, SPIE Advanced Lithography, 2019, San Jose, California, USA (16 pgs).

Japanese Office Action dated Jan. 28, 2025 for Application No. 2023-569657.

Japanese Office Action dated Jun. 10, 2025 for Application No. 2023-569657.

* cited by examiner

METHOD OF METAL OXIDE INFILTRATION INTO PHOTORESIST

CROSS-REFERENCE TO RELATED APPLICATIONS

This application claims benefit of U.S. Patent Provisional Application Ser. No. 63/217,062, filed Jun. 30, 2021, which is incorporated herein by reference in its entirety.

BACKGROUND

Field

Examples of the present disclosure generally relate to methods for enhancing photoresist profile control. Particularly, examples of the present disclosure provide methods for forming metal-oxides in the photoresist to improve profile control.

Description of the Related Art

Integrated circuits have evolved into complex devices that can include millions of components (e.g., transistors, capacitors and resistors) on a single chip. Photolithography may be used to form components on a chip. Generally the process of photolithography involves forming a photoresist layer on a substrate. The photoresist layer may be formed by, for example, spin-coating. The photoresist layer may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region, and can be from any suitable source, e.g., a 193 nm ArF laser, an electron beam, an ion beam, or other source. Excess solvent may then be removed in a pre-exposure bake process.

During an exposure stage, a photomask or reticle may be used to selectively expose certain regions of a photoresist layer disposed on the substrate to electromagnetic radiation. Other exposure methods may be maskless exposure methods. Exposure to light may decompose the photoacid generator, which generates acid and results in a latent acid image in the resist resin. After exposure, the substrate may be heated in a post-exposure bake process. During the post-exposure bake process, the acid generated by the photoacid generator reacts with the resist resin in the photoresist layer, changing the solubility of the resist of the photoresist layer during a subsequent development process.

After the post-exposure bake, the substrate and the photoresist layer are developed and rinsed. Subsequently, a patterned photoresist layer is then formed on the substrate. Openings are defined within the patterned photoresist layer, after the development and rinse processes, exposing the underlying target material for etching to transfer features onto a target material. Factors such as inaccurate control or low resolution of the lithography exposure process, or resilience of the patterned layer, may cause poor critical dimension of the patterned photoresist layer, resulting in unacceptable line width roughness (LWR). Large line width roughness (LWR) of the patterned photoresist layer may result in inaccurate feature transfer to the target material, which can eventually lead to premature device failure and yield loss.

Therefore, there is a need for improved patterned photoresist layer.

SUMMARY

Examples of the present disclosure relate to methods for forming metal-oxides in a photoresist to improve profile control. In one example, a method for infiltrating a photoresist layer is disclosed. The method includes forming a metal oxide in the photoresist layer by pressurizing a methyl-containing material in a processing environment proximate a film stack. The film stack includes the photoresist layer disposed on top of and in contact with an underlayer. The underlayer is disposed on top of a substrate. The method further includes etching the film stack including the photoresist layer implanted with the metal oxide.

In another example, a method for infiltrating a photoresist layer includes pressurizing a methyl-containing material in a processing environment proximate a film stack. The film stack includes the photoresist layer disposed on top of and in contact with an underlayer. The underlayer is disposed on top of a substrate. The method further includes heating the methyl-containing material to a predetermined temperature, and converting the methyl-containing material to a metal oxide, in the photoresist layer. The method includes, etching the film stack including the photoresist layer implanted with the metal oxide.

In yet another example, a semiconductor processing system is provided that includes a semiconductor processing chamber. A non-transitory computer readable medium stores instructions that when executed by a processor cause a method to be performed in the semiconductor processing chamber. The method includes forming a metal oxide in a photoresist layer by pressurizing a methyl-containing material in a processing environment proximate a film stack. The film stack includes the photoresist layer disposed on top of and in contact with an underlayer. The underlayer is disposed on top of a substrate. The method includes etching the film stack including the photoresist layer implanted with the metal oxide.

BRIEF DESCRIPTION OF THE DRAWINGS

So that the manner in which the above recited features of examples of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, where possible, to designate identical elements that are common to the figures. It is contemplated that elements disclosed in one example may be beneficially utilized on other examples without specific recitation.

DETAILED DESCRIPTION

Examples of the present disclosure relate to methods for forming metal-oxides in a photoresist to improve profile control. The methods disclosed herein are directed to formation or infiltration of a metal oxide into a photoresist layer.

In a conventional resist layer, a material of the resist is selected from a polymer in order to control parameters, such as selectivity and line width roughness, when a film stack, in which the resist layer is formed, is exposed to an etchant, and vias or trenches are formed in an underlayer of the film stack. However, when the resist layer is selected from a polymer, and the underlayer is formed from complex metallic or amorphous compounds, undercuts can form at the interface of the resist layer and the underlayer. Conventional approaches to improving selectivity may involve multiple depositions of the resist layer, or improvements to the structure of the polymer of each of the resist layers. The conventional approach method, however, may require changes to the composition of the photoresist depending on the size of a feature intended to be patterned.

According to the methods disclosed herein, a metal oxide is formed in patterned photoresist layer. A methyl-containing material is introduced into a semiconductor processing chamber having a film stack disposed therein. The methyl-containing material can also include one of aluminum, hafnium or zirconium. The film stack, in one example, includes a substrate, an underlayer disposed on the substrate, and the patterned photoresist layer disposed on the underlayer. The film stack, and thus the patterned photoresist layer is heated, and the methyl-containing material is absorbed into the patterned photoresist layer. Subsequently, the processing environment is purged, and the film stack is exposed to an oxidizing agent, such as $H_2O$. The oxidizing agent is heated under pressure and may form water or water vapor on the film stack. The oxidizing agent is absorbed into the patterned photoresist layer and oxidizes the absorbed methyl-containing material. Upon oxidation, the methyl-containing material forms a metal oxide in the patterned photoresist layer. When the methyl-containing material is a tri-methylaluminum (TMA) precursor that is introduced into the processing environment, and subsequently purged and pumped, $H_2O$ is introduced into the processing environment in a single pre-etch process, i.e., without repeatedly introducing TMA prior to oxidizing and etching the film stack. The pre-etch process includes any one or all of the processes of the disclosed method (discussed in detail below) prior to etching of the film stack. Beneficially, a single pre-etch process enables the metal oxide to infiltrate into the photoresist layer between about 20 nm and about 40 nm. Furthermore, the metal oxide is cross-linked throughout the entire thickness of patterned photoresist. Repeating one or all of the pre-etch processes, prior to etching the film stack, halts the infiltration of the methyl-containing material, and thus halts the infiltration of the metal oxide throughout the thickness of the photoresist layer. In some examples disclosed herein, the entire method, i.e., a full cycle that includes the pre-etch process and etching of the film stack, can then be repeated.

The method disclose herein is independent of feature size. Advantageously, infiltration of the metal oxide into the underlayer can achieve a change in critical dimension of less than 1 nm, and the line width roughness is changed by less than 0.4 nm. Accordingly, the method of infiltration of the metal oxide into the polymer ensures that the metal oxide does not infiltrate into the underlayer, by controlling the properties of the photoresist layer, including density, with respect to the properties of the underlayer. For example, the photoresist can be selected from a low density carbonyl group material, and the underlayer selected from a high density material, such as silicon, germanium, gallium, or derivatives thereof, including each of the materials disclosed infra.

Figure 1:
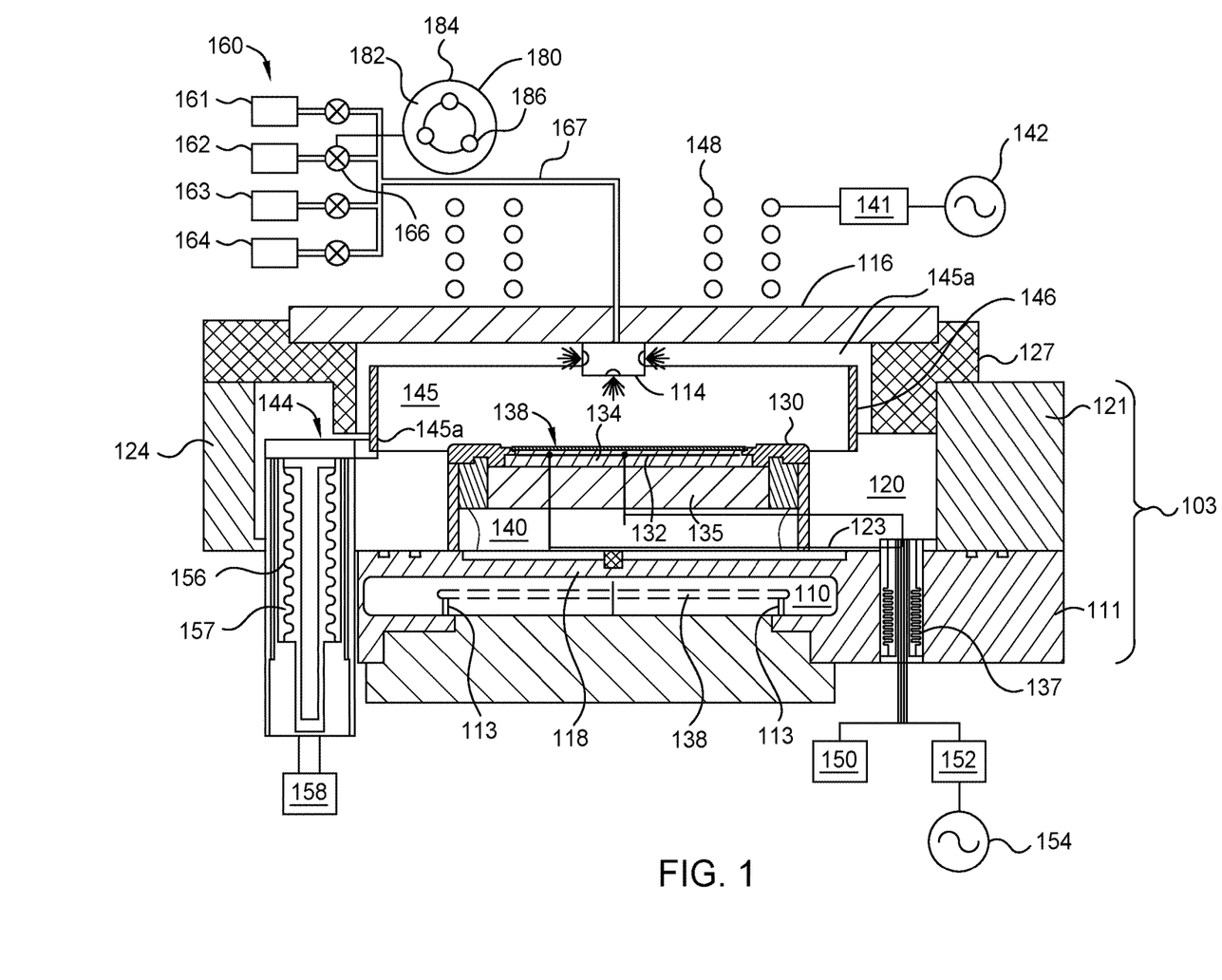
FIG. 1 depicts an exemplary processing chamber configured to perform a patterning and etching of a substrate.

FIG. 1 is a schematic sectional view of a processing chamber 100, such as dual load lock chamber. It is understood that the processing chamber 100 is exemplary, and that other processing chambers can be adapted to perform the method disclosed herein.

In addition, the processing chamber 100 is suitable for performing a deposition process. One example of the processing chamber that may be adapted to benefit from the disclosure is a CENTRIS® Sym3™ etching processing chamber, available from Applied Materials, Inc., located in Santa Clara, California. The processing chamber can also be configured for deposition, particularly atomic layer deposition (ALD). One example of an ALD tool is an iSprint™ ALD/CVD SSW chamber configured with the Centura®, or Endura® systems.

The processing chamber 100 includes an upper chamber volume 120 for transferring and processing a substrate 138, and a lower chamber volume 110 for transferring a substrate 138. The upper chamber volume 120 and the lower chamber volume 110 are vertically stacked and are isolated from one another. Each of the lower and upper chamber volumes 110, 120 may be selectively connectable to two adjacent external environments (i.e., a factory interface and transfer chamber, both not shown) through two openings configured for substrate transferring. Examples of substrate sizes include 200 mm diameter, 250 mm diameter, 300 mm diameter and 450 mm diameter, among others.

The processing chamber 100 includes a chamber body 103. In one example, the chamber body 103 includes an upper chamber body 121 and a lower chamber body 111 coupled together to define the lower and upper chamber volumes 120, 110. The processing chamber 100 may include a hoop assembly 144 configured to confine a confinement region in the upper chamber volume 120 as well as load and unload substrates. Although the hoop assembly 144 is described in the context of a load lock chamber having a processing volume, is it understood that the hoop assembly 144 may be utilized in any suitably adapted load lock and/or processing chamber, including those having a single processing volume, where it is desirable to have a symmetrical confinement region. The processing chamber 100 may include supporting pins 113 for supporting a substrate 138 in the lower chamber volume 110.

The upper chamber volume 120 is defined by sidewalls 124 of the upper chamber body 121, a bottom wall 123 of the upper chamber body 121, an upper wall 118 of the lower chamber body 111, and a chamber lid assembly 116. The upper chamber volume 120 is suitable for patterning a material layer, forming a material layer disposed on a substrate 138, and etching. In an example that is not shown, it is also contemplated that one or more plasma generators may be optionally utilized to sustain a plasma within the upper chamber volume 120 in lieu of, or in addition to a remote plasma source. It is contemplated that other process chambers, including those from other manufactures, may be adapted to practice examples of the disclosure.

A substrate support pedestal 140 is disposed in the upper chamber volume 120 to support the substrate 138 during processing. A cover ring 130 is disposed on the ESC 134 and along the periphery of the substrate support pedestal 140. The cover ring 130 is configured to confine etching gases to a desired portion of the exposed top surface of the substrate 138, while shielding the top surface of the substrate support pedestal 140 from the plasma environment inside the processing chamber 100. Lift pins (not shown) are selectively moved through the substrate support pedestal 140 to lift the substrate 138 above the substrate support pedestal 140 to facilitate access to the substrate 138 by a transfer robot (not shown) or other suitable transfer mechanism.

The substrate support pedestal 140 includes an electrostatic chuck (ESC) 134 for holding the substrate 138 during processing. The ESC 134 uses the electrostatic attraction to hold the substrate 138 to the substrate support pedestal 140. The ESC 134 is powered by an RF power supply 154 integrated with a match circuit 152. The ESC 134 includes an electrode 132 embedded within a dielectric body. The electrode 132 is coupled to the RF power supply 154 and provides a bias, which attracts plasma ions, formed by the process gases in the upper chamber volume 120, to the ESC 134 and substrate 138 positioned thereon. The RF power supply 154 may cycle on and off, or pulse, during processing of the substrate 138. The plasma generator may be RF driven coils positioned outside or within the upper chamber volume 120, and/or an RF driven electrode disposed in the substrate support pedestal 140.

The ESC 134 may include heaters disposed therein and connected to a power source (not shown), for heating the substrate, while a cooling base 136 supporting the ESC 134 may include conduits for circulating a heat transfer fluid to maintain a temperature of the ESC 134 and substrate 138 disposed thereon. The ESC 134 is configured to perform in the temperature range desired by the thermal budget of the device being fabricated on the substrate 138. For example, the ESC 134 may be configured to maintain the substrate 138 at a temperature of about −25 degrees Celsius to about 150 degrees Celsius, such as between about 50 degrees Celsius and about 100 degrees Celsius.

The cooling base 136 is provided to assist in controlling the temperature of the substrate 138. To mitigate process drift and time, the temperature of the substrate 138 may be maintained substantially constant by the cooling base 136. In one example, the temperature of the substrate 138 is maintained throughout subsequent cleaning processes at about 30 degrees Celsius to 120 degrees Celsius.

A power source 150 is coupled to the electrode. The power source 150 provides a chucking voltage of about 200 volts to about 2000 volts to the electrode 132. The power source 150 may also include a system controller (not shown) for controlling the operation of the electrode 132 by directing a DC current to the electrode 132 for chucking and de-chucking the substrate 138. A vertical tube 137 provides a passage for power supplies, sensors and other wiring to be used by the substrate support pedestal 140.

The hoop assembly 144 is disposed in the upper chamber volume 120 according one example of the present invention. As previously stated, the hoop assembly 144 may be used in other processing chambers and/or load lock chambers. The hoop assembly 144 has at least two functions. First, the hoop assembly 144 is vertically positionable to enable transfer of substrates between the substrate support pedestal 140 and substrate transfer devices (e.g., robot end effectors) entering the upper chamber volume 120. Second, the hoop assembly 144 is also positionable to define a cylindrical confinement region 144a around the substrate 138 and region immediately above the substrate support pedestal 140 during processing, thus, providing a symmetrical processing environment in the upper chamber volume 120 which enhances processing results. The hoop assembly 144 may also be utilized solely for establishing a symmetrical confinement region within the processing volume.

The hoop assembly 144 includes a ring-shaped hoop body 146 disposed within the upper chamber volume 120. The hoop body 146 has an inner diameter, which is greater than a diameter of the substrate support pedestal 140. The hoop body 146 is coupled to a shaft 157 that extends through the chamber body 103 to a lift actuator 158. The lift actuator 158, such as a linear actuator or motor, is operable to control the vertical elevation of the hoop body 146 within the upper chamber volume 120. In one example, a bellows assembly 156 is provided to prevent leakage between the shaft 157 and the chamber body 103.

The hoop assembly 144 also includes three or more lifting fingers (not shown) attached to the hoop body 146. The lifting fingers are configured to transfer substrates between the substrate support pedestal 140 and substrate transfer devices, such as robots, extending into the upper chamber volume 120 when the hoop assembly 144 is in an upper transfer position, as shown in FIG. 1.

The hoop assembly 144 also includes a hoop 145 attached to the hoop body 146. The hoop 145 extends vertically upwards from the hoop body 146. In one example, the hoop 145 is a cylindrical ring having a substantially cylindrical inner wall 145a. A height 145b of the inner wall 145a is much greater than the thickness of the substrate 138 so that the inner wall 145a can confine a portion of the processing volume as a cylindrical confinement region 144a around and above the substrate 138. The inner wall 145a of the hoop 145 has a diameter greater than the outer diameter of the substrate support pedestal 140. In one example, the hoop 145 has a height sufficient to simultaneously overlap the substrate support pedestal 140 during processing.

A gas panel 160 is coupled by a gas line 167 to the chamber lid assembly 116 to supply process gases into the upper chamber volume 120. The gas panel 160 may include one or more process gas sources 161, 162, 163, 164 and may additionally include inert gases, non-reactive gases, and reactive gases, if desired. In one example, the gas panel 160 is configured to deliver a metal precursor, such as aluminum, hafnium, or zirconium. In one example, the gas panel is configured to deliver tri-methylaluminum (TMA). In another example, the gas panel 160 is configured to deliver gas precursors and vapor phased precursors, such as tetrakis (ethylmethylamido) zirconium(IV) (TEMAZr), and tetrakis (ethylmethylamido)hafnium(IV) (TEMAHf). The gas panel 160 can be adapted to include one or more vapor-phase precursor sources disposed in, or coupled thereto. The vapor-phase precursor source vaporizes a liquid precursor, provided from a liquid-phase precursor ampoule in fluid communication therewith, using a thermal and, or, vacuum enhanced vaporization process. In other examples, the vapor-phase precursor source is a liquid injection vaporizer configured to provide a mixture of the vapor-phase precursor and a carrier gas to the upper chamber volume 120 of the processing chamber 100. In some examples, the vapor-phase precursor source is configured to vaporize or sublimate a solid precursor.

Additional examples of process gases that may be provided by the gas panel 160 include, but are not limited to, hydrocarbon containing gas including methane ($CH_4$), silicon containing gas, such as sulfur hexafluoride ($SF_6$), silicon chloride ($SiCl_4$), or organic silicon containing gas, such as bis(diethylamido) Silane (BDEAS), tris(dimethylamino)silane (TDMAS), bis(tertiary-butylamino)silane (BTBAS), carbon tetrafluoride ($CF_4$), hydrogen bromide (HBr), hydrocarbon containing gas, argon gas (Ar), chlorine ($Cl_2$), nitrogen ($N_2$), helium (He) and oxygen gas ($O_2$). Additionally, process gases may include nitrogen, chlorine, fluorine, oxygen and hydrogen containing gases such as $BCl_3$, $C_2F_4$, $C_4F_8$, $C_4F_6$, $C_2F_2$, $C_2F_6$, $C_5F_8$, $CHF_3$, $CH_2F_2$, $CH_3F$, $F_2$, $NF_3$, $NH_3$, $CO_2$, $SO_2$, CO, $N_2$, $NO_2$, $N_2O$ and $H_2$ among others.

Valves 166 control the flow of the process gases from the sources 161, 162, 163, 164 from the gas panel 160 and are managed by a controller 180. The flow of the gases supplied to the upper chamber volume 120 from the gas panel 160 may include one of the disclosed gases or combinations of the gases.

The chamber lid assembly 116 includes a nozzle 114, which is fluidically coupled to the gas line 167. The nozzle 114 has one or more ports for introducing the process gases from the sources 161, 162, 164, 163 of the gas panel 160 into the upper chamber volume 120. After the process gases are introduced into the processing chamber 100, the gases are energized to form plasma. Alternatively, a gas or precursor is provided to the upper chamber volume and the precursor is pulsed under pressure for a predetermined time, enabling the precursor to react with a substrate surface, for example, by ALD.

An antenna 148, such as one or more inductor coils, may be provided adjacent to the processing chamber 100. An antenna power supply 142 may power the antenna 148 through a match circuit 141 to inductively couple energy, such as RF energy, to the process gas to maintain a plasma formed from the process gas in the upper chamber volume 120 of the processing chamber 100. Alternatively, or in addition to the antenna power supply 142, process electrodes below the substrate 138 and/or above the substrate 138 may be used to capacitively couple RF power to the process gases to maintain the plasma within the upper chamber volume 120. The operation of the antenna power supply 142 may be controlled by a controller, such as the controller 180, which also controls the operation of other components in the processing chamber 100.

The controller 180 is coupled to the processing chamber to control the operation of the processing chamber 100. For example, the controller 180 is configured to control flow of various precursor and process gases and purge gases from gas sources, during different operations of a substrate processing sequence. The controller 180 includes a processor 182, memory 184, and support circuits 186 for the processor 182 and facilitates control of the components of the processing chamber 100. The controller 180 may be one of any form of general-purpose computer processor that can be used in an industrial setting for controlling various chambers and sub-processors. The memory 184 stores software (source or object code) that may be executed or invoked to control the operation of the processing chamber 100 in the manner described herein. The memory 184 is a non-transitory computer-readable medium and may be one or more of readily available memory such as random access memory (RAM), read only memory (ROM), or any other form of digital storage, local or remote. The memory 184 contains instructions that, when executed by the processor 182, facilitate execution of the method 200 (shown in FIG. 2).

To facilitate control of the processing chamber 100, the processor 182 may be one of any form of general purpose computer processor, or a general purpose central processing unit (CPU), each of which can be used in an industrial setting, such as a programmable logic controller (PLC), for controlling various chambers and sub-processors. Support circuits 186 are coupled to the processor 182 for supporting the processor in a conventional manner. Charged species generation, heating, and other processes are generally stored in the memory 184, typically as software routine. The software routine may also be stored and/or executed by a second CPU (not shown) that is remotely located from the processing chamber 100 being controlled by the processor 182.

The memory 184 is in the form of computer-readable storage media that contains instructions, that when executed by the processor 182, facilitates the operation of the processing chamber 100. The instructions in the memory 184 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the examples (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Figure 2:
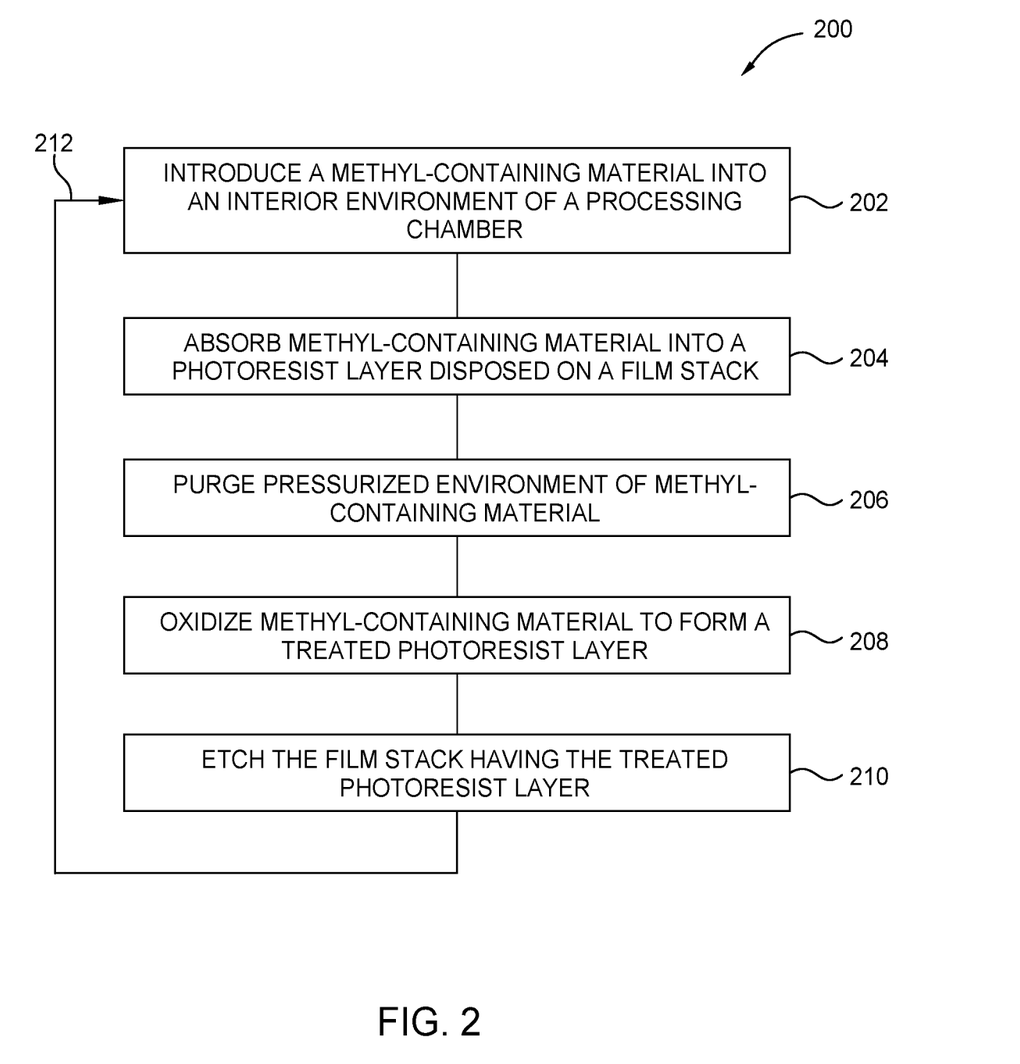
FIG. 2 illustrates a flowchart of a method of patterning a film stack disposed on the substrate shown in FIG. 1.

FIG. 2 illustrates a flowchart of a method 200 of patterning a film stack 300. In one example, the film stack 300 is patterned by a process of photolithography and etching. FIGS. 3A-3E illustrate cross-sectional views of a portion of the film stack 300 at various stages of the method 200.

Figure 3A:
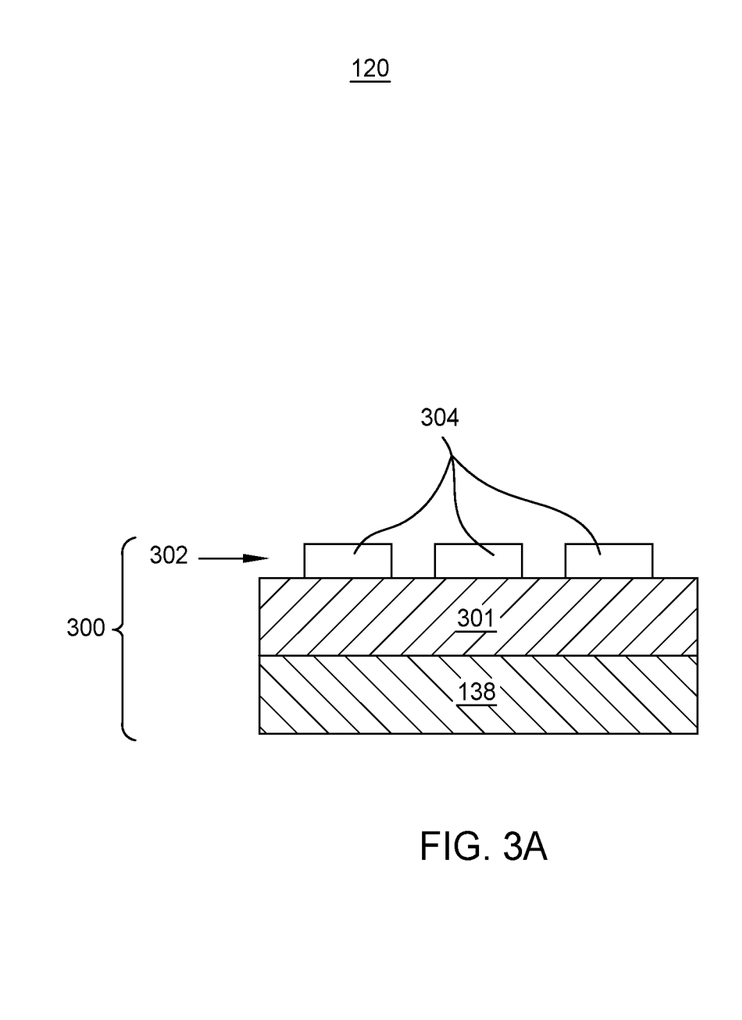
FIGS. 3A-3E are cross-sectional views of the film stack during patterning and etching of the film stack.

FIG. 3A illustrates a cross-section of the film stack 300 that includes the substrate 138 having an underlayer 301 disposed on top of and in contact with the substrate 138. The film stack 300 also includes a photoresist layer 302 disposed on top of and in contact with the underlayer 301. The photoresist layer 302 includes one or more patterned layers 304. To better illustrate examples of the disclosure, the patterned layers 304 are shown adjacent to one another having gaps therebetween. However, it is understood that the examples of the patterned layers 304 of the photoresist layer 302 can be arranged having connected portions of the photoresist layer 302, without departing from the disclosure. Exemplary materials for the substrate 138 include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. The substrate 138, or surface thereof, can also be made of dielectric materials such as silicon dioxide, silicon nitride, organosilicates, and carbon dopes silicon oxide or nitride materials.

In one example, the underlayer 301 may be a sol-gel solution or a nanoparticle solution. The first solution may include silicon dioxide ($SiO_2$) and/or silicon oxycarbide (SiOC). Proportions of $SiO_2$, SiOC, in the first solution are controlled to result in a first refractive index. For example, the first solution may contain a first ratio of $SiO_2$, or SiOC. In one embodiment, sol-gel precursors for $SiO_2$ may include tetramethyl orthosilicate (TMOS), methyl-tri-methoxy-silane (MTMS), and tetraethyl orthosilicate (TEOS). A first refractive layer may include a first material, and a subsequent refractive layer may include a second material different from the first material. A series of refractive layers of metals and/or dielectrics of varying dielectric constants and refractive indices, such as a graded anti-reflective coating (ARC), reduce glare, reflection, or blur. The refractive index of the encapsulation layer can be tuned from over about 2.0 to about 1.47. Exemplary ranges for a refractive index of the underlayer 301 can be between about 1.5 and about 2.0, for example about 1.75. In yet other example, the refractive index of the underlayer 301 can between about 1.0 and about 1.5, for example about 1.47. In yet another example, the refractive index of the underlayer 301 can be between about 1.0 and about 1.5, for example about 1.48 or about 1.49; or between about 1.0 and about 1.5, for example about 1.47.

Figure 3B:
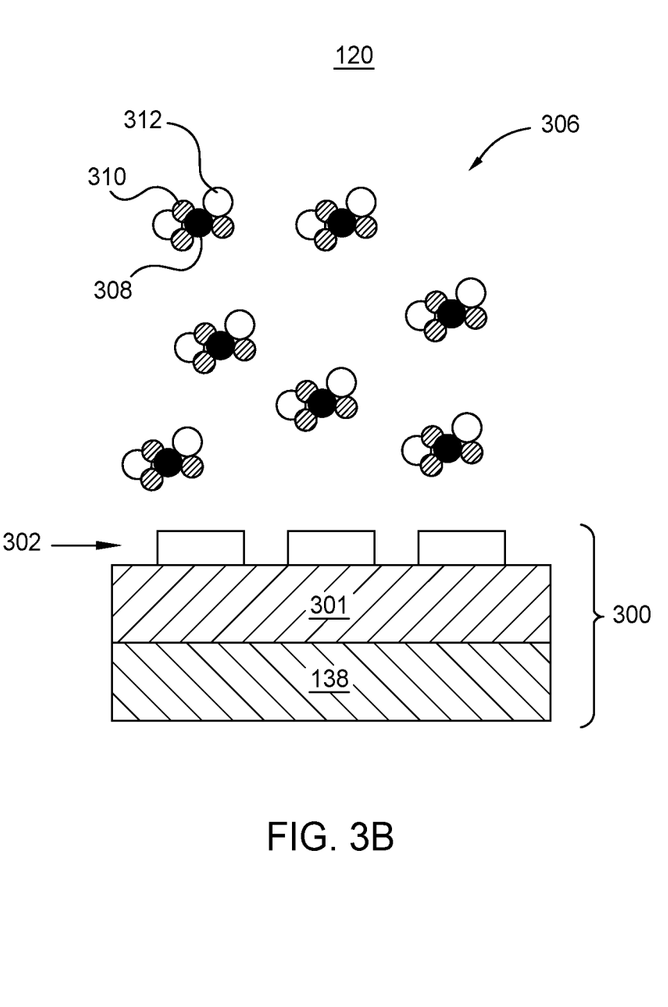

Referring to FIG. 2 and FIG. 3B, the method 200 begins at operation 202 where a methyl-containing material 306 is provided to a processing volume of a processing chamber, e.g., the upper chamber volume 120 of the processing chamber 100, having the film stack 300 disposed therein. The methyl-containing material is provided to the processing volume (e.g., upper chamber volume 120) at a high pressure. In one example, the methyl-containing material 306 is a gas that includes tri-methylaluminum (TMA). Alternatively, the methyl-containing material 306 can be provided as a vapor or liquid, which can be provided to the processing volume. In one example, the vapor or liquid includes (TEMAZr) or (TEMAHf). The methyl-containing material 306 is provided to the upper chamber volume 120 at a predetermined temperature, pressure, and time. The methyl-containing material 306 includes aluminum atoms 308, hydrogen atoms 310, and carbon atoms 312. In one example, methyl-containing material 306 is provided to the upper chamber volume 120 at the high pressure for a predetermined time and temperature. For example, the pressure can be from about 100 mTorr to about 10 Torr, such as about 1 Torr to about 10 Torr, or between about 3 Torr and about 7 Torr. The predetermined time is between about 1 second to about 45 seconds, such as between about 10 seconds and 30 seconds. In another example, the pressurized methyl-containing material 306 is provided to the upper chamber volume 120 for about 15 seconds, or about 20 seconds, or about 30 seconds. In at least one example, the predetermined temperature is between about 0 degrees Celsius and about 150 degrees Celsius, such as about 50 degrees Celsius and about 100 degrees Celsius, such as between about 75 degrees Celsius and about 100 degrees Celsius.

Figure 3C:
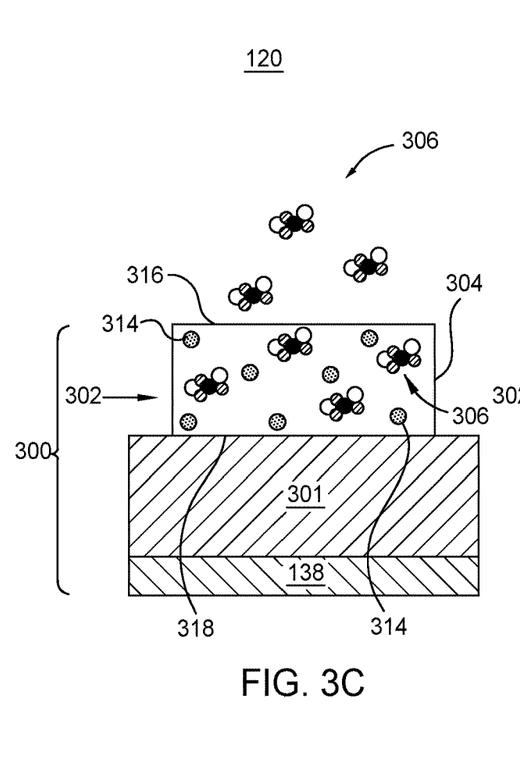

At operation 204, the methyl-containing material is absorbed into a patterned photoresist layer. For example, the heat provided into the upper chamber volume 120 enables the methyl-containing material 306 to diffuse into the patterned layers 304 of the photoresist layer 302, as shown in FIG. 3C. The heat also enables gaps or space to be formed between polymers 314 which the methyl-containing material 306 infiltrates when under pressure. For simplicity, FIG. 3C only illustrates one patterned layer 304 in the film stack 300. Polymers 314 within the photoresist layer 302 are sufficiently dispersed to enable the methyl-containing material 306 to diffuse through a top surface 316 of the photoresist layer 302, enabling the methyl-containing material 306 to occupy space between polymers 314. The photoresist layer 302 is saturated with the methyl-containing material 306. Accordingly, the methyl-containing material 306 is confined between the top surface 316 and a bottom surface 318 of the photoresist layer 302. Otherwise stated, the methyl-containing material 306 is absorbed and evenly dispersed throughout a thickness of the photoresist layer 302, the thickness defined as a distance between the top surface 316 and a bottom surface 318.

The processing volume is purged of the methyl-containing material at operation 206. For example, a purge gas is introduced into the upper chamber volume 120 for about 20 seconds. After about 20 seconds, the flow of the purge gas is stopped and the purge gas, along with any residual methyl-containing material 306, is evacuated from the upper chamber volume 120 using one or more dedicated vacuum pumps for about 20 seconds. The one or more dedicated vacuum pumps (not shown) are part of a vacuum pump system (not shown), in one example. The purge gas is a non-reactive gas, which can be $N_2$ in one example. In another example, the purge gas is a chemically inert gas, such as Ar or He Purging enables a top surface 316 of the photoresist layer 302 to be substantially free of the methyl-containing material 306 in preparation for oxidation at operation 208.

Figures 3D, 3E:
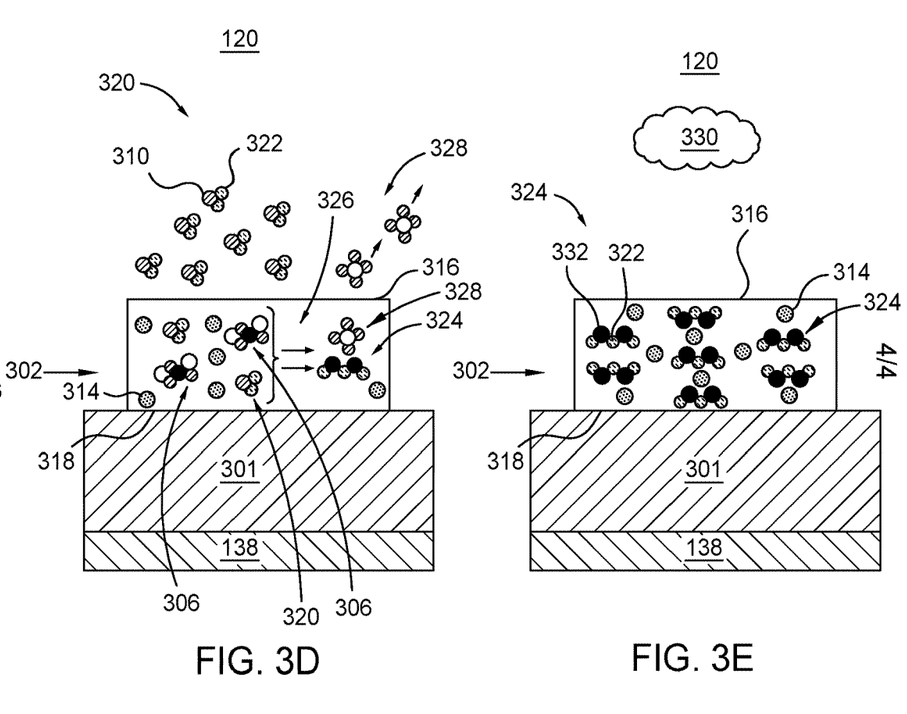

FIGS. 3D-3E illustrate oxidation of the film stack, as described in operation 208. An oxidizing agent 320, containing oxygen atoms 322 and hydrogen atoms 310, is introduced into the upper chamber volume 120. In one example, the oxidizing agent 320 is water, which can be provided to the upper chamber volume 120 as a liquid or gas, as shown in FIG. 3D. When the methyl-containing material 306 interacts with the oxidizing agent 320 in an oxidation process 326, a metal oxide 324 and a by-product gas 328 are formed within the photoresist layer 302. The by-product gas 328 diffuses out of the photoresist layer 302 passing through the surfaces of the pattered layers 304, including the top surface 316. There is substantially no diffusion of the by-product gas 328 through the underlayer 301, since the top surface 316 of the photoresist layer 302 is in contact with the upper chamber volume 120, and a material included in the underlayer 301 is denser than any gases within the upper chamber volume 120.

When the methyl-containing material 306 is TMA, alumina ($AlO_x$) is the metal oxide 324 created, and the by-product gas 328 is methane. In one example, the $AlO_x$ can be $Al2O_3$, $Al_2O$, $AlO_2$, or AlO. Alternatively, if the methyl-containing material 306 is TEMAZr, oxidation causes the metal oxide 324 to form as ZrOx, such as $ZrO_2$, ZrO, in the photoresist layer 302. When the methyl-containing material 306 is TEMAHf, oxidizing the methyl-containing material 306 produces HfOx, such as is $HfO_2$, in the photoresist layer 302. A concentration of the metal oxide 324 is between about 30 percent and about 60 percent of the volume of the photoresist layer 302. TEMAZr and TEMAHf infiltrate photoresist layer 302, but do not infiltrate throughout the thickness of the photoresist layer 302, as compared to TMA. TEMAZr and TEMAHf infiltrate closer to the top surface 316 of the photoresist layer 302, forming a crust-like layer having TEMAZr and/or TEMAHf along with polymer 314 proximate the top surface 316, and a layer of polymer 314 proximate the bottom surface 316. For example, TEMAZr and TEMAHf can infiltrate into the photoresist layer 302 from about 0.05 nm to about 2 nm, such as about 1 nm or about 1.5 nm. As such, polymer 314 is formed throughout the remaining thickness of the photoresist layer 302. Advantageously, selectivity during subsequent etching of the film stack 300 is higher with ZrOx or HfOx compared to $AlO_x$.

The photoresist layer 302 is exposed to the oxidizing agent at a predetermined pressure, temperature, and time. The oxidizing agent 320 is provided under pressure to the processing volume of the processing chamber, at the high pressure. For example, the oxidizing agent 320 can be provided to the upper chamber volume 120 (i.e., a processing volume) at a pressure between about 100 mTorr to about 10 Torr, such as about 1 Torr to about 10 Torr, or between about 3 Torr and about 7 Torr. A temperature at which the oxidizing agent 320 is provided to the processing volume is between about 50 C and about 100 C, such as between about 75 C and about 100 C.

In one example, the predetermined time at which the oxidizing agent 320 is provided to the upper chamber volume 120 is between about 1 second and about 400 seconds, in one example. A hydrolysis reaction oxidizes the methyl-containing material in the photoresist layer for the predetermined time. In another example, the predetermined time is between about 240 seconds and about 350 seconds, such as about 270 second, or about 300 seconds, or about 330 seconds. The predetermined time ensures that the oxidation process 326 occurs between the entirety of the photoresist layer 302, enabling metal oxide 324 to form uniformly dispersed between the top surface 316 and the bottom surface 318. If the photoresist layer 302 is exposed to an oxidizing source for less than the predetermined time, a layer of alumina may form near the top surface 316 of the photoresist layer 302 without forming throughout the photoresist layer 302, thus creating a layer of polymer 314 proximate the bottom surface 318. If the photoresist layer 302 is exposed to an oxidizing source, such as oxidizing agent 320, for less than the predetermined time, metal oxide 324 can concentrate at the top surface 316 of the mask creating a crust, despite the methyl-containing material 306 extending through a thickness of the photoresist layer 302.

Illustrated in FIG. 3E, the metal oxide 324 formed at operation 208, includes metal atoms 332 and oxygen atoms 322. In one example, when the methyl-containing material 306 is TMA, the metal atoms 332 are aluminum, thus forming alumina ($AlO_x$) as the metal oxide 324. Alternatively, when the methyl-containing material 306 is TEMAZr, the metal atoms 332 are zirconium, such that the metal oxide 324 formed is zirconium oxide ($ZrO_x$). In yet another example, when TEMAHf is the methyl-containing material 306, the metal oxide 324 formed is hafnium oxide ($HfO_x$), and the metal atoms 332 are hafnium.

At operation 210, the film stack having a treated patterned photoresist layer is etched. For example, the film stack 300 is exposed to etchants 330, which can be a dry etch or a wet etch. In one example, the film stack 300 is exposed to etchants 330 from a plasma formed from any of the processing gases discussed above, such as a fluorine-containing gas, or a carbon-fluorine containing gas. When exposed to plasma, constituents from the processing gases, including ions, neutrons, protons, and radicals are created when the processing gases are disassociated by the application of an electric field created by the RF generator or DC power source, as detailed above. Advantageously, the metal oxide 324 formed at operation 208 improves etch selectivity at operation 210. Optionally, at operation 212, the method 200 may return to operation 202, where another photoresist layer 302 is deposited, and the film stack 300 is again exposed to the methyl-containing material 306.

Examples of the present disclosure relate to methods for forming metal-oxides in photoresist to improve profile control. Advantageously, the methods disclosed herein can achieve a critical dimension (CD) of less than 1 nm, and a line width roughness (LWR) of less than 0.4 nm. As used herein, the term "about" may refer to a +/−10% variation from the nominal value. It is to be understood that such a variation can be included in any value provided herein. While the foregoing is directed to examples of the present disclosure, other and further examples of the disclosure may be devised without departing from the basic scope thereof, and the scope thereof is determined by the claims that follow.

What is claimed is:

1. A method for infiltrating a photoresist layer, the method comprising:
   heating a methyl-containing material in a processing environment proximate a film stack, the film stack comprising patterned photoresist layers disposed on top of and in contact with an underlayer having a refractive index of between 1.47 and 2.0, wherein a metal oxide and a by-product gas are formed by interaction of the methyl-containing material with an oxidizing agent within the patterned photoresist layers near a top surface of the patterned photoresist layers, wherein the by-product gas diffuses out of the photoresist layer and does not diffuse through the underlayer; and
   etching portions of the underlayer exposed from the patterned photoresist layers infiltrated with the metal oxide.

2. The method of claim 1, further comprising:
   absorbing the methyl-containing material through the top surface of the patterned photoresist layers.

3. The method of claim 2, wherein the methyl-containing material is absorbed throughout a thickness of the patterned photoresist layers, and the metal oxide is alumina.

4. The method of claim 1, further comprising:
   maintaining the patterned photoresist layers at a pressure to enable the methyl-containing material to absorb throughout a thickness of the patterned photoresist layers.

5. The method of claim 4, wherein the methyl-containing material is subject to a temperature of about 0 degrees to about 150 degrees Celsius, for between about 1 second to about 45 seconds.

6. The method of claim 1, wherein the infiltrating of the patterned photoresist layers further comprises:
   oxidizing the methyl-containing material in the patterned photoresist layers.

7. The method of claim 1, further comprising:
   purging the processing environment of the methyl-containing material, prior to oxidizing the methyl-containing material.

8. The method of claim 7, further comprising:
   maintaining a hydrolysis reaction to oxidize the methyl-containing material in the patterned photoresist layers for a predetermined time between about 1 second and about 400 seconds.

9. The method of claim 1, wherein the infiltrating of the patterned photoresist layers further comprises:
   oxidizing the methyl-containing material in the patterned photoresist layers; and
   converting substantially all of the methyl-containing material to alumina.

10. The method of claim 9, wherein the film stack is etched with a fluorine-containing gas, or a carbon-fluorine containing gas.

11. A method for infiltrating a photoresist layer, the method comprising:
    pressurizing a methyl-containing material in a processing environment proximate a film stack, the film stack comprising patterned photoresist layers disposed on top of and in contact with an underlayer having a refractive index of between 1.47 and 2.0;
    heating the methyl-containing material to a predetermined temperature;

oxidizing the methyl-containing material in the patterned photoresist layers, wherein a metal oxide and a by-product gas are formed by interaction of the methyl-containing material with an oxidizing agent within the patterned photoresist layers near a top surface of the patterned photoresist layers, wherein the by-product gas diffuses out of the photoresist layer and does not diffuse through the underlayer; and etching portions of the underlayer exposed from the patterned photoresist layers infiltrated with the oxidized methyl-containing material.

12. The method of claim 11, further comprising:

maintaining the patterned photoresist layers at a pressure to enable the methyl-containing material to absorb throughout a thickness of the patterned photoresist layers, and the oxidized methyl-containing material is alumina.

13. The method of claim 12, wherein the methyl-containing material is subject to a temperature of about 0 degrees to about 150 degrees Celsius, for between about 1 second to about 45 seconds.

14. The method of claim 11, further comprising:

purging the processing environment of the methyl-containing material, prior to oxidizing the methyl-containing material.

15. The method of claim 14, wherein:

the methyl-containing material in the patterned photoresist layers is oxidized for a predetermined time between about 1 second and about 400 seconds.

16. The method of claim 11, wherein:

the oxidizing of the methyl-containing material in the patterned photoresist layers comprises:

converting substantially all of the methyl-containing material to alumina, wherein the film stack is etched with a fluorine-containing gas, or a carbon-fluorine containing gas.

17. A semiconductor processing system, comprising:

a semiconductor processing chamber; and a non-transitory computer readable medium storing instructions, the instructions when executed by a processor cause a method to be performed in the semiconductor processing chamber, the method comprising:

selectively infiltrating patterned photoresist layers with a metal oxide by pressurizing a methyl-containing material in a processing environment proximate a film stack, the film stack comprising the patterned photoresist layers disposed on top of and in contact with an underlayer having a refractive index of between 1.47 and 2.0, wherein a metal oxide and a by-product gas are formed by interaction of the methyl-containing material with an oxidizing agent within the patterned photoresist layers near a top surface of the patterned photoresist layers, wherein the by-product gas diffuses out of the photoresist layers and does not diffuse through the underlayer; and etching portions of the underlayer exposed from the patterned photoresist layers infiltrated with the metal oxide.

18. The semiconductor processing system of claim 17, wherein the infiltrating of the patterned photoresist layers further comprises:

oxidizing the methyl-containing material in the patterned photoresist layers; and converting substantially all of the methyl-containing material to alumina.

19. The semiconductor processing system of claim 17, wherein the method further comprises:

heating the patterned photoresist layers at a pressure to enable the methyl-containing material to absorb throughout a thickness of the patterned photoresist layers, and the metal oxide is alumina.

* * * * *